(12) United States Patent
Watanabe et al.

(10) Patent No.: US 6,477,360 B1
(45) Date of Patent: Nov. 5, 2002

(54) FREQUENCY CONVERTER

(75) Inventors: Osamu Watanabe; Takafumi Yamaji, both of Yokohama; Hiroshi Tanimoto, Kawasaki; Shoji Otaka, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/518,879

(22) Filed: Mar. 6, 2000

(30) Foreign Application Priority Data

Mar. 9, 1999 (JP) .......................... 11-061440

(51) Int. Cl.$^7$ ................................ H04B 1/26
(52) U.S. Cl. .................. 455/318; 455/307; 455/323
(58) Field of Search ................ 455/302, 305, 455/307, 313, 315, 316, 317, 318, 319, 323; 327/355, 113

(56) References Cited

U.S. PATENT DOCUMENTS

| 5,634,207 A | | 5/1997 | Yamaji et al. ............... 455/323 |
| 5,715,529 A | * | 2/1998 | Kianush et al. ............. 455/307 |
| 5,760,632 A | | 6/1998 | Kawakami et al. ......... 327/355 |
| 6,122,496 A | * | 9/2000 | Yoshioka .................... 455/307 |
| 6,106,425 A | * | 12/2000 | Laurent et al. ............. 455/323 |

FOREIGN PATENT DOCUMENTS

EP    0 726 646 A1    8/1996    ............ H03B/1/04
JP    7-131253         5/1995    ............ H03D/7/14

OTHER PUBLICATIONS

Ken Leong Fong, et al., "A Class AB Monolithic Mixer for 900–MHz Applications", IEEE, JSSC, vol. 32, No. 8, Aug. 1997, pp. 1166–1172.

Fong K. L. et al.; "A Class AB Monolithic Mixer for 900–MHz Applications"; IEEE Journal of Solid–State Circuits, US IEEE Inc.; New York; vol. 32, No. 8; Aug. 1, 1997; pp. 1166–1172; XP000731533; ISSN: 0018–9200.

* cited by examiner

*Primary Examiner*—Thanh Cong Le
(74) *Attorney, Agent, or Firm*—Michael Best & Friedrich LLC (57) ABSTRACT

A frequency converter includes a multiplying circuit, a load circuit, and an output buffer circuit. The multiplying circuit is arranged to multiply an RF signal and an LO signal and output a difference frequency signal with a frequency, which is the difference between the frequencies of the two signals, from its output terminal. The load circuit is arranged to connect the output terminal of the multiplying circuit to a power supply. The output buffer circuit is arranged to have an input terminal connected to the output terminal of the multiplying circuit, and an output terminal for outputting a signal to the next stage. A notch circuit for removing an undesired signal frequency component is combined in the load circuit. The notch circuit has an impedance characteristic in which the impedance is abruptly reduced to provide a valley point at the undesired signal frequency.

20 Claims, 6 Drawing Sheets

FREQUENCY CONVERTER

CROSS-REFERENCE TO RELATED APPLICATION

This application is based upon and claims the benefit of priority from the prior Japanese Patent Application No. 11-061440, filed Mar. 9, 1999, the entire contents of which are incorporated herein by reference.

BACKGROUND OF THE INVENTION

The present invention relates to a frequency converter for use mainly in radio-communication equipment, and more particularly to a frequency converter for outputting a wide band signal.

In the receiver of radio-communication equipment, such as a portable radio-communication device, a frequency converter is arranged to convert a received signal to a signal having a predetermined frequency. As a frequency converter for treating a relatively narrow band signal, a well known one is disclosed, for example, in "A Class AB Monolithic Mixer for 900-MHz Applications"; Ken Leong Fong, Chistopher Dennis Hull, and Robert G. Meyer; IEEE J. Solid-State Circuits, vol. 32, No. 8, AUGUST 1997, p. 1166, which will be referred to as Publication 1.

Figure 23:
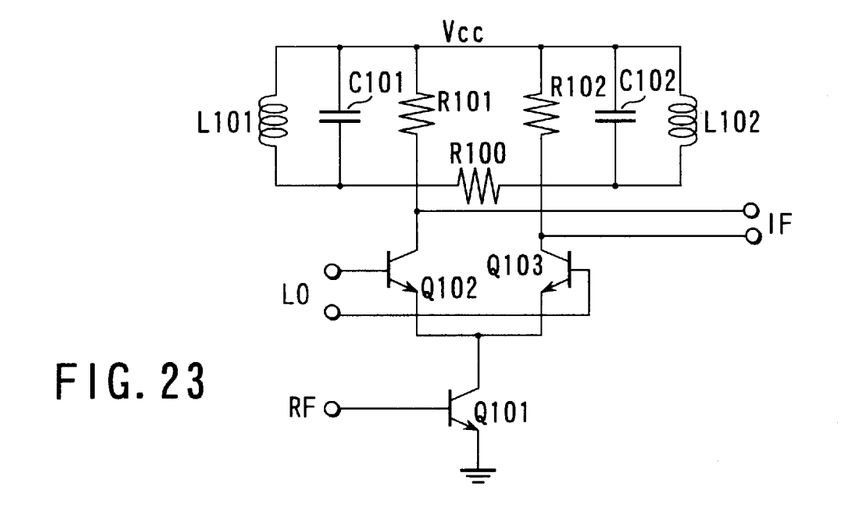
FIG. 23 is a circuit diagram showing the structure of a conventional frequency converter.

FIG. 23 shows a frequency converter disclosed in Publication 1. The circuit includes a multiplying circuit formed of transistors Q101, Q102, and Q103. From the collectors of the transistors Q102 and Q103, an IF (intermediate frequency) signal is outputted as a current signal, which is a difference frequency signal between an RF (radio frequency) signal frequency and an LO (local oscillation) signal frequency. The output terminals of the multiplying circuit are connected to a load circuit including load resistors R100, R101, and R102, to which two LC parallel resonance circuits consisting of inductors L101 and L102 and capacitors C101 and C102 are connected, so that this part functions as a band pass filter. The load circuit is generally designed to match with the impedance of transmission lines.

In recent years, in place of narrow band modulation systems of several hundred kHz used for PHS (Personal Handy-phone System) and GSM (Global System for Mobile Communication), wide band modulation systems of several MHz or more, such as CDMA (Code Division Multiple Access) and OFDM (Orthogonal Frequency Division Multiplex) have come into use. When such a modulation signal with a wide band is converted into an IF signal with a frequency of about 200 MHz, the fractional band width of the signal becomes larger than that in the case of narrow band modulation systems by one multiple of ten.

The frequency converter shown in FIG. 23 has been developed for use in converting the frequency of a signal produced by narrow band modulation systems. Where the circuit is used for treating a signal with a wide fractional band width produced by wide band modulation systems, impedance matching can not be achieved over the entire signal band, thereby bringing about a fluctuation in the output signal level. If the LC parallel resonance circuits are provided with exterior elements to form a load circuit with a high Q (Quality) factor and thereby to expand the signal band, the resultant circuit structure becomes complicated. In this case, the number of exterior elements increases, thereby making integration circuits less compact and expensive, which is opposite to the desired requirements. In order to achieve impedance matching over a wide band, there is another method in which the Q factor of the resonance circuits is reduced. However, in this case, the output signal revel is lowered, thereby deteriorating the S/N ratio.

Figure 24:
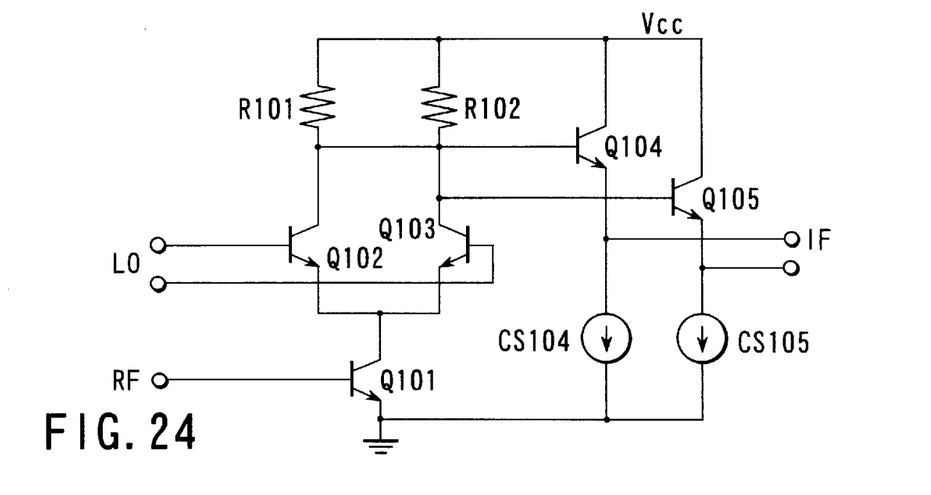
FIG. 24 is a circuit diagram showing the structure of another conventional frequency converter.

On the other hand, the structure shown in FIG. 24 is known as a frequency converter which can achieve impedance matching over a wide band. This circuit also includes a multiplying circuit formed of transistors Q101, Q102, and Q103. From the collectors of the transistors Q102 and Q103, an IF signal is outputted through an emitter follower circuit, which is formed of transistors Q104 and Q105 with current supplies CS104 and CS105 used as a load. This frequency converter can achieve impedance matching over a wide frequency range. The conversion gain is decided on the basis of the trans-conductance due to the transistors Q101, Q102, and Q103, and load resistors R101 and R102. The conversion gain is easily larger, and thus a sufficient output signal level is ensured.

However, the frequency converter shown in FIG. 24 has a problem in that an LO signal frequency component of a high level and its higher harmonic frequency components are included as undesired signal components, beside the desired IF signal component, in the output signal from the collector of the transistors Q102 and Q103. Such an undesired signal component of a high level causes transistors Q104 and Q105 in an output buffer circuit of the next stage to be saturated, thereby distorting the desired signals.

A method of utilizing a double balancing mixer is known to cancel the LO signal frequency component. However, in the double balancing mixer, the second harmonic of the LO signal frequency undesirably appears as an electric current flowing through the load resistor of the mixer. Particularly, where the LO signal frequency is high, the second harmonic component becomes large, thereby causing a problem as in the circuit shown in FIG. 24.

As described above, the conventional frequency converters have a problem in that the S/N ratio and the distortion characteristic have to be sacrificed where the circuits are designed to convert the frequency of a signal with a wide band.

BRIEF SUMMARY OF THE INVENTION

An object of the present invention is to provide a frequency converter which can treat a wider band while maintaining a high S/N ratio and a low distortion.

According to a first aspect of the present invention, there is provided a frequency converter comprising:

a multiplying circuit configured to multiply an RF (Radio Frequency) signal and an LO (Local Oscillation) signal and output a difference frequency signal having a difference frequency between those of the RF and LO signals from an output terminal;

a load circuit connected to the output terminal of the multiplying circuit;

an output buffer circuit having an input terminal connected to the output terminal of the multiplying circuit and an output terminal for outputting a signal into a next stage; and a notch circuit connected to the input terminal of the output buffer circuit and configured to have an impedance characteristic in which impedance is abruptly reduced to provide a valley point at an undesired signal frequency, in order to remove a component with the undesired signal frequency from the difference frequency signal.

According to a second aspect of the present invention, there is provided a frequency converter comprising:

a multiplying circuit configured to multiply an RF (Radio Frequency) signal and an LO (Local Oscillation) signal and output a difference frequency signal having a difference frequency between those of the RF and LO signals, the difference frequency signal comprising differential signal components outputted from first and second output terminals, respectively;

a load circuit connected to the first and second output terminals of the multiplying circuit;

an output buffer circuit having first and second input terminals connected to the first and second output terminals of the multiplying circuit, respectively, and an output terminal for outputting a signal into a next stage; and a notch circuit connected to the first and second input terminals of the output buffer circuit and configured to have an impedance characteristic in which impedance is abruptly reduced to provide a valley point at an undesired signal frequency, in order to remove a component with the undesired signal frequency from the difference frequency signal, the notch circuit comprising first and second LC series resonance circuits connected to the first and second output terminals of the multiplying circuit, respectively, and having a resonance frequency in agreement with the undesired signal frequency.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described hereinafter with reference to the accompanying drawings. In the following description, the constituent elements having substantially the same function and arrangement are denoted by the same reference numerals, and a repetitive description will be made only when necessary.

Figure 1A:
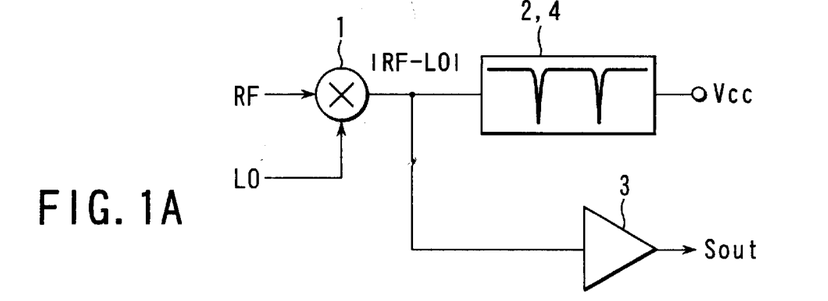
FIG. 1A is a block diagram showing the basic constitution of a frequency converter according to an embodiment of the present invention.

FIG. 1A is a block diagram showing the basic constitution of a frequency converter according to an embodiment of the present invention. The frequency converter includes a multiplying circuit 1, a load circuit 2, and an output buffer circuit 3. The multiplying circuit 1 is arranged to multiply an RF (radio frequency) signal and an LO (local oscillation) signal, which are inputted into the circuit 1, and output a difference frequency signal with a frequency, which is the difference between the frequencies of the two signals, from its output terminal. The load circuit 2 is connected to the output terminal of the multiplying circuit 1 and a power supply Vcc (power-supply-potential point). The output buffer circuit 3 is arranged to have an input terminal connected to the output terminal of the multiplying circuit 1, and an output terminal for outputting a signal to the next stage.

A notch circuit 4 for removing an undesired signal frequency component is combined in the load circuit 2 and connects the output terminal of the multiplying circuit 1 to the power-supply-potential point. In other words, the notch circuit 4 connects the input terminal of the output buffer circuit 3 to the power-supply-potential point or a constant potential point. The notch circuit 4 has an impedance characteristic (impedance vs. frequency) with a notch frequency in agreement with at least one undesired signal frequency.

The term "notch frequency" is used to stand for a frequency at which the impedance abruptly decreases, thereby providing a valley point in the impedance characteristic. Preferably, the impedance value of the valley point is smaller than the impedance of the output buffer circuit 3 at the undesired signal frequency.

Figure 1B:
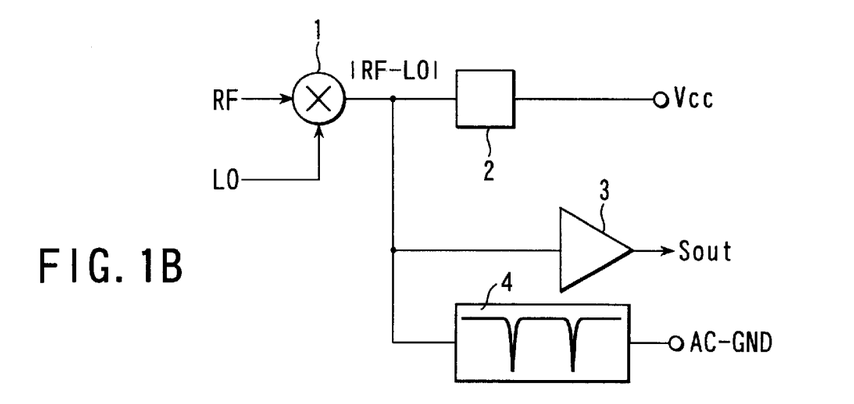
FIG. 1B is a block diagram showing the basic constitution of a frequency converter according to another embodiment of the present invention.

FIG. 1B is a block diagram showing the basic constitution of a frequency converter according to another embodiment of the present invention. The frequency converter also includes a multiplying circuit 1, a load circuit 2, and an output buffer circuit 3, as in the converter shown in FIG. 1A. However, a notch circuit 4 is arranged not to be combined in the load circuit 2, but to connect the input terminal of the output buffer circuit 3 to a ground potential point AC-GND or a constant potential point. This notch circuit 4 also has an impedance characteristic (impedance vs. frequency) with a notch frequency in agreement with at least one undesired signal frequency.

In the output of the multiplying circuit 1 of each of the frequency converters shown in FIGS. 1A and 1B, an LO signal frequency component and its higher harmonic frequency components appear as undesired signal components, beside the desired signal, i.e., the IF (intermediate frequency) signal component, which is a difference frequency signal between the RF signal frequency and the LO signal frequency. However, the frequency converters prevent an undesired signal component of a high level, i.e., the LO signal frequency component or its higher harmonic frequency component, outputted from the multiplying circuit 1 from being transmitted to the next output buffer circuit 3. This is possible due to the fact that the notch circuit 4 has an impedance characteristic with a notch frequency in agreement with an undesired signal frequency.

Accordingly, the input portion of the output buffer circuit 3 is not saturated with an undesired signal, thereby reducing distortion of the desired signal. Further, the undesired signal component is removed by the notch frequency of the notch circuit 4, the impedance characteristic of the notch circuit 4 becomes flat in the desired signal band.

In addition to the impedance characteristic of the notch circuit 4 being flat in the desired signal band, the impedance characteristic of the output buffer circuit 3 is also flat. As a result, the frequency converters shown in FIGS. 1A and 1B have a sufficient converting gain in the desired signal band, thereby providing an output signal of a high level and a high S/N ratio.

Figure 2:
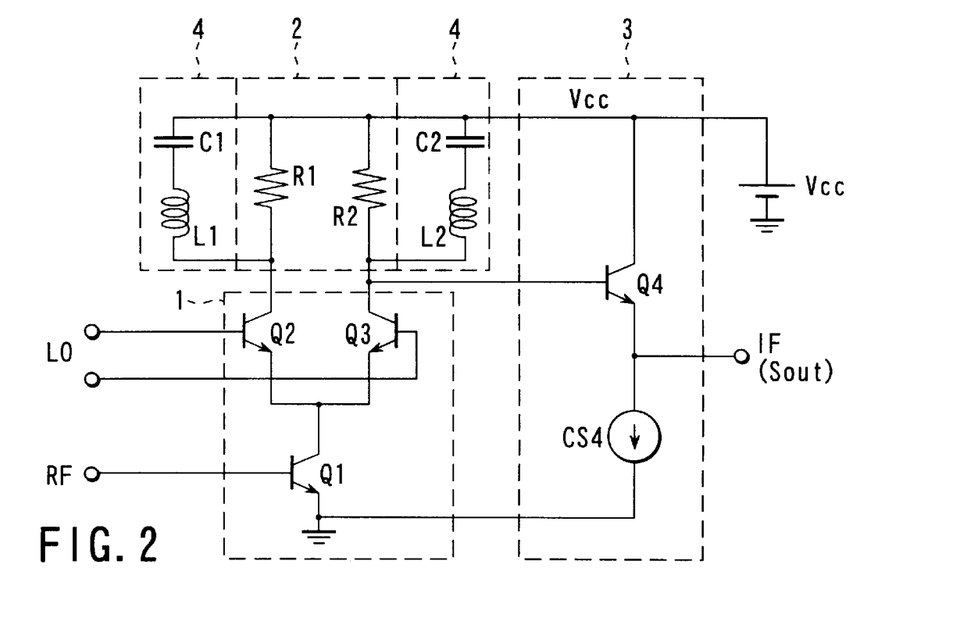
FIG. 2 is a circuit diagram showing a specific example of the frequency converter shown in FIG. 1A.

FIG. 2 is a circuit diagram showing a specific example of the frequency converter shown in FIG. 1A. The notch circuits to be explained with reference to FIGS. 2 to 22 may be applied to the notch circuits 4 of the frequency converter shown in FIG. 1B.

In FIG. 2, there is shown a modifying circuit 1 including transistors Q1, Q2, and Q3. The collector terminal of the transistor Q1 is connected to the common emitter terminal of the transistors Q2 and Q3, while the emitter terminal of the transistor Q1 is grounded. An RF signal is inputted into the base terminal of the transistor Q1, and an LO signal is inputted between the base terminals of the transistors Q2 and Q3. From the collector terminals of the transistors Q2 and Q3, which are the output terminals of the multiplying circuit 1, an IF (intermediate frequency) signal is mainly outputted as a current signal, which is a difference frequency component between the RF signal and the LO signal inputted into the multiplying circuit 1.

The current signal components outputted from the collector terminals of the transistors Q2 and Q3 are current-voltage-converted by the load resistors in a load circuit 2. The signal produced by current-voltage-converting the current signal component from the collector terminal of the transistor Q3 is inputted into the output buffer circuit 3. In this structure, the load circuit 3 includes load resistors R1 and R2 connected between the power supply Vcc and the transistors Q2 and Q3, respectively.

The notch circuit 4 includes two LC series resonance circuits connected in parallel to the load resistors R1 and R2, respectively. The LC series resonance circuit connected in parallel to the load resistor R1 consists of an inductor L1 and a capacitor C1. The LC series resonance circuit connected in parallel to the load resistor R2 consists of an inductor L2 and a capacitor C2.

The output of the multiplying circuit 1 includes, beside the desired IF signal component, undesired signal components, particularly, an LO signal frequency component. However, the LC series resonance circuits of the notch circuit 4 have a resonance frequency in agreement with the LO signal frequency, so that the LO signal frequency component is removed. More specifically, since the LC series resonance circuits have a minimum impedance at the resonance frequency, the gain becomes almost zero at the LO signal frequency if the resonance frequency agrees with the LO signal frequency. Consequently, the LO signal frequency component is not transmitted to the output buffer circuit 3, and the transistor Q4 of the output buffer circuit 3 is prevented from being saturated by the LO signal frequency component.

In other words, even if an undesired signal component, such as the LO signal frequency component or its higher harmonic frequency component, is outputted from the multiplying circuit 1, hardly any unnecessary distortion is caused in the output buffer circuit 3, so that the desired signal component with a low distortion is obtained as a frequency-converted output from the output buffer circuit 3.

Note that, the conductivity type of the transistors arranged in the structure shown in FIG. 2 may be completely reversed, i.e., from the NPN transistor shown in FIG. 2 to PNP transistors. In this case, the relationship between the Vcc and the ground is also reversed. Furthermore, in place of the bipolar transistors shown in FIG. 2, MOS transistor may be used.

Figure 3:
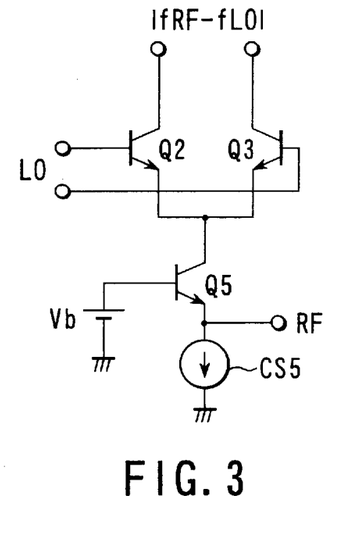
FIGS. 3 and 4 are circuit diagrams each showing a modification of a multiplying circuit used in the frequency converters according to the present invention.
Figure 4:
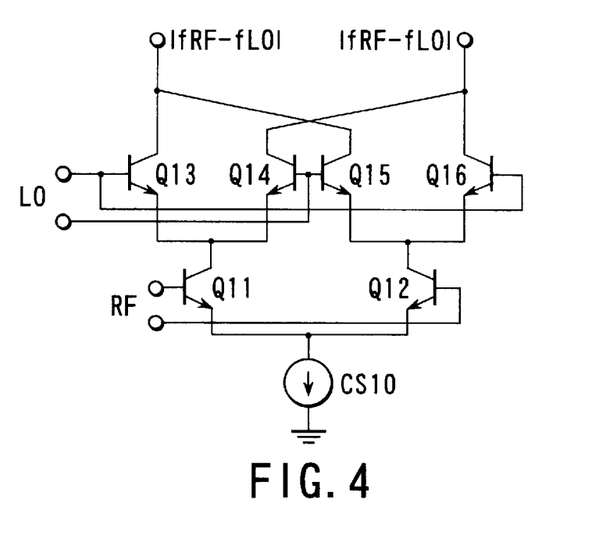

An explanation will be given to other specific structures of parts of the embodiment shown in FIGS. 1A and 1B. FIGS. 3 and 4 are circuit diagrams each showing a modification of a multiplying circuit 1.

In the multiplying circuit shown in FIG. 3, a DC bias voltage Vb is applied to the base terminal of a transistor Q5 corresponding to the transistor Q1 shown in FIG. 2, and the emitter terminal of the transistor Q5 is connected to a current source CS5. An RF signal is inputted into the emitter terminal of the transistor Q5. An IF signal, which is a difference frequency signal component between the RF signal frequency and the LO signal frequency, is outputted as a desired signal from the multiplying circuit as in FIG. 2. Furthermore, the LO signal frequency component and its higher harmonic frequency components are outputted as undesired signal components.

The multiplying circuit shown in FIG. 4 is a well known multiplying circuit of the balanced modulator type formed of transistors Q11 to Q16 and a current source CS10. An RF signal is inputted between the base terminals of the transistors Q11 and Q12, which have a common emitter terminal connected to the current source CS10. The collector terminals of the transistors Q11 and Q12 are connected to the common emitter terminal of the transistors Q13 and Q14, and the common emitter terminal of the transistors Q15 and Q16, respectively. The opposite phase components of an LO signal are inputted into the base terminals of the transistors Q13 and Q14, respectively, and also into the base terminals of the transistors Q15 and Q16, respectively.

The opposite phase components of an IF signal or a desired signal, which is a difference frequency signal between the RF signal frequency and the LO signal frequency, are outputted from a node between the collector terminals of the transistors Q13 and Q15, and a node between the collector terminals of the transistors Q14 and Q16, respectively. Furthermore, in the multiplying circuit, an undesired signal formed mainly of the second harmonic component of the LO signal is outputted.

Figure 5:
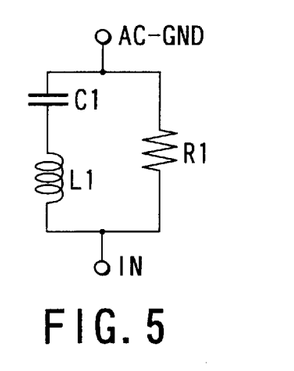
FIGS. 5 to 7 are circuit diagrams each showing a modification of the combination of a load circuit and a notch circuit used in the frequency converters according to the present invention.
Figure 6:
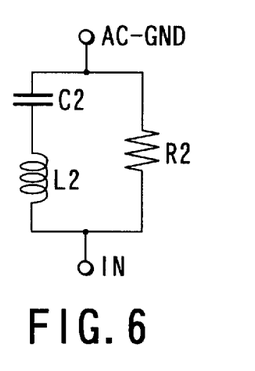
Figure 7:
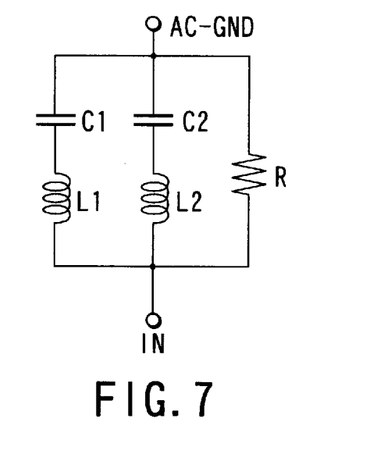

FIGS. 5 to 7 are circuit diagrams each showing a modification of the combination of a load circuit 2 and a notch circuit 4. In the structure shown in FIG. 5, an LC series resonance circuit consisting of an inductor L1 and a capacitor C1 is connected in parallel to a load resistor R1. In the structure shown in FIG. 6, an LC series resonance circuit consisting of an inductor L2 and a capacitor C2 is connected in parallel to a load resistor R2. In the structure shown in FIG. 7, an LC series resonance circuit consisting of an inductor L1 and a capacitor C1 and an LC series resonance circuit consisting of an inductor L2 and a capacitor C2 are connected in parallel to a load resistor R.

In each of the structures shown in FIGS. 5 to 7, one of the terminals (the input terminal IN) is connected to the output terminal of a multiplying circuit 1, and the other terminal is connected to a power supply Vcc, i.e., to a AC-GND. As shown in FIGS. 2 to 4, where the multiplying circuit 1 has differential outputs, a combination circuit of a load circuit and a notch circuit is connected to each of the outputs ((+)side and (−)side) of the multiplying circuit 1. Preferably, the two combination circuits connected to the two output terminals of the multiplying circuit 1 are substantially the same, in light of the balance of the circuit structure. The two combination circuits may be connected to a common AC-GND or separate AC-GNDS.

Figure 8:
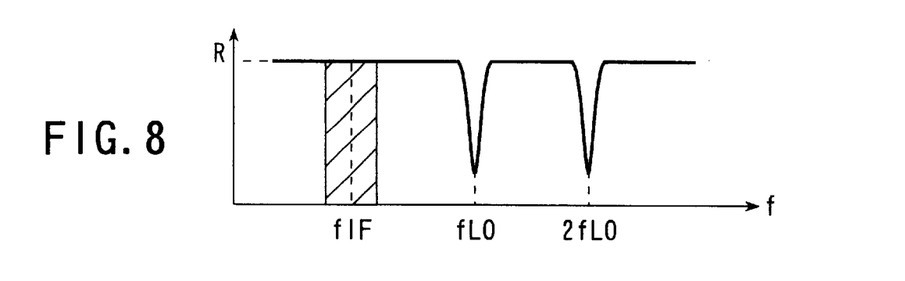
FIG. 8 is a graph showing the impedance characteristic of the notch circuit shown in FIG. 7.

L1 and C1, and L2 and C2 in FIGS. 5 to 7 are set to satisfy the following formulas (1) and (2), for example.

$$\omega LO = 1/(L1 \cdot C1)^{1/2} \quad (1)$$

$$2\omega LO = 1/(L2 \cdot C2)^{1/2} \quad (2)$$

where ωLO (=2 πfLO) is the angular frequency of the LO signal, and 2 ωLO is the angular frequency of the second harmonic of the LO signal. Accordingly, the circuits shown in FIGS. 5 and 6 have impedance characteristics with notch frequencies at frequencies of fLO and 2 fLO, respectively. On the other hand, the circuit shown in FIG. 7 has an impedance characteristic with notch frequencies at two frequencies of fLO and 2 fLO, as shown in FIG. 8.

The circuits shown in FIGS. 5 to 7 are formed only of a load circuit and an LC series resonance circuit or circuits connected in parallel, and thus can be realized with a simple structure. Where the Q factor of an LC series resonance circuit is large, or the LO signal frequency and the IF signal frequency are high, the load impedance takes on the value of a lord resistor at the IF signal frequency, and thus a flat characteristic can be obtained over the entire frequency band of the IF signal.

Figure 9:
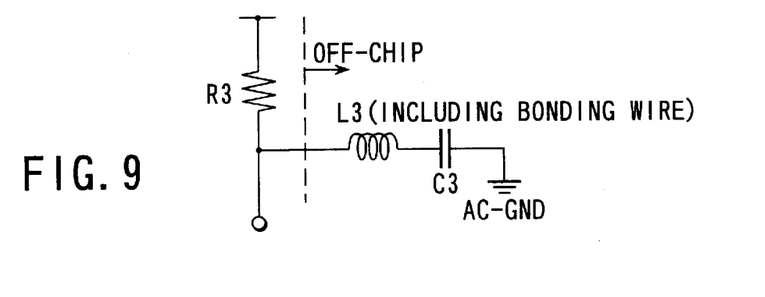
FIGS. 9 to 13 are circuit diagrams each showing a modification of the combination of a load circuit and a notch circuit used in the frequency converters according to the present invention.

FIGS. 9 to 13 are circuit diagrams each showing another modification of the combination of a load circuit 2 and a notch circuit 4. An LC series resonance circuit used in the notch circuit 4 may be formed in either an off-chip state (external structure), or an on-chip state. The notch circuit 4 shown in FIG. 9 is an example in which an LC series resonance circuit is formed in an off-chip state. In this structure, an LC series resonance circuit consisting of an off-chip inductor L3 (including the inductance of a bonding wire) and an off-chip capacitor C3 is connected to a load resistor R3.

Where an LC series resonance circuit is formed in an off-chip state, as in this example, constituent parts with a high Q factor can be used for both the inductor L3 and the capacitor C3, in consideration of the inductance of the bonding wire. Furthermore, as shown in FIG. 9, one of the terminals of the LC series resonance circuit is grounded at a position outside the chip, the in-phase component and the differential component of an undesired signal are sufficiently suppressed.

Figure 10:
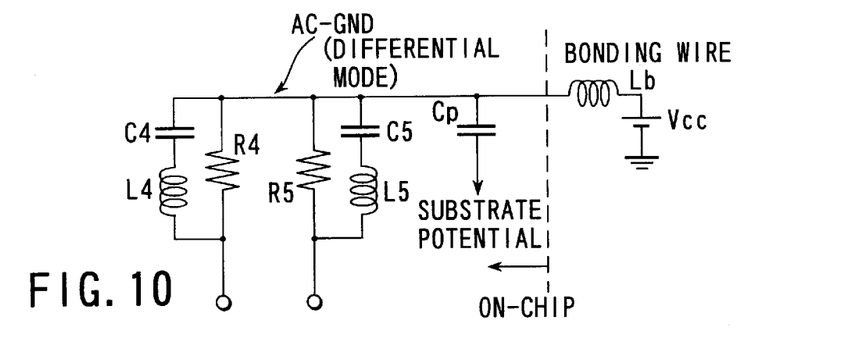

The notch circuit 4 shown in FIG. 10 is an example in which LC series resonance circuits are formed in an on-chip state. In this structure, an LC series resonance circuit consisting of a inductor L4 and a capacitor C4 is connected in parallel to a load resistor R4. An LC series resonance circuit consisting of a inductor L5 and a capacitor C5 is connected in parallel to a load resistor R5. The two LC series resonance circuits are formed in an on-chip state. The terminals on one side of the LC series resonance circuits are connected to the two output terminals of a multiplying circuit 1, respectively. The terminals on the other side of the LC series resonance circuits are connected to the substrate potential of this integrated circuit through a parasitic capacitor Cp of a pad, and to a power supply Vcc and thus to AC-GND through a bonding wire having a inductance Lb.

Where an LC series resonance circuit is formed in an on-chip state, as in this example, the Q factor of the resonance circuit is low. Furthermore, for example, where a large error is caused in the inductance Lb of a bonding wire, it is difficult to adjust the resonance frequency of a resonance circuit formed in an off-chip state. For the reasons described above, a resonance circuit formed in an on-chip state is more advantageous such that the resonance frequency can be relatively easily aligned with a target frequency, e.g., an LO signal frequency or its higher harmonic frequency. Furthermore, where an undesired signal is formed of differential signal components, the undesired signal can be suppressed without receiving influences of the inductance Lb of a bonding wire and the capacitance Cp of a pad, if an LC series resonance circuit is formed in an on-chip state.

Figure 11:
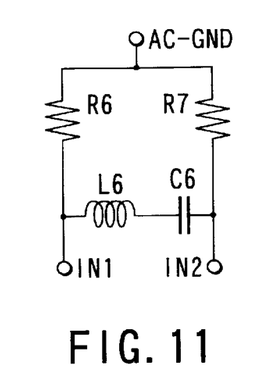
Figure 12:
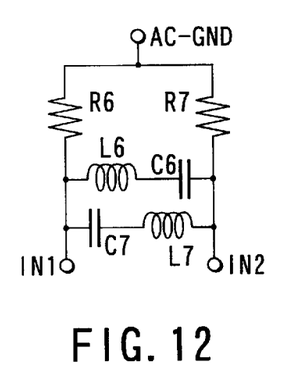
Figure 13:
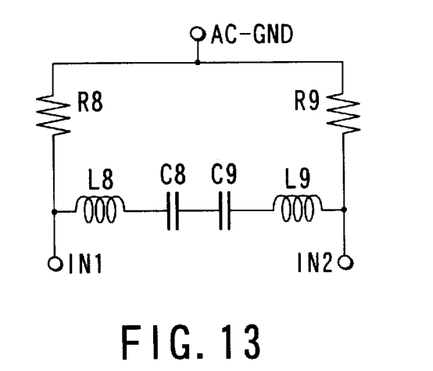

The load and notch circuits shown in FIGS. 11 to 13 are examples in which an undesired signal outputted from a multiplying circuit 1 consists of differential signal components. Each of the examples has two input terminals IN1 and IN2. There are shown load resistors R6, R7, R8, and R9, and LC series resonance circuits formed of inductors L6, L7, L8, and L9, and capactors C6, C7, C8, and C9. Each of the LC series resonance circuits is connected between the input terminals IN1 and IN2. Preferably, the two LC series resonance circuits show in FIGS. 12 and 13 are substantially the same.

In the load and notch circuits, the inductor and the capacitor of each LC series resonance circuit may be arranged in an on-chip state or an off-chip state. Instead, the inductor and the capacitor of each LC series resonance circuit may be arranged in an on-chip state and an off-chip state, respectively, or vice versa. Furthermore, LC series resonance circuits arranged in an on-chip state and an off-chip state may be used as a pair.

Figure 14:
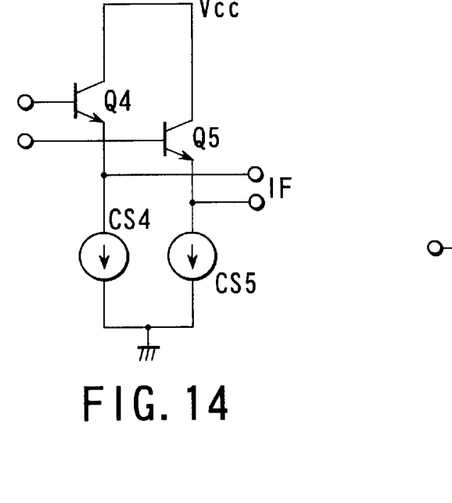
FIGS. 14 and 15 are circuit diagrams each showing a modification of an output buffer circuit used in the frequency converters according to the present invention.
Figure 15:
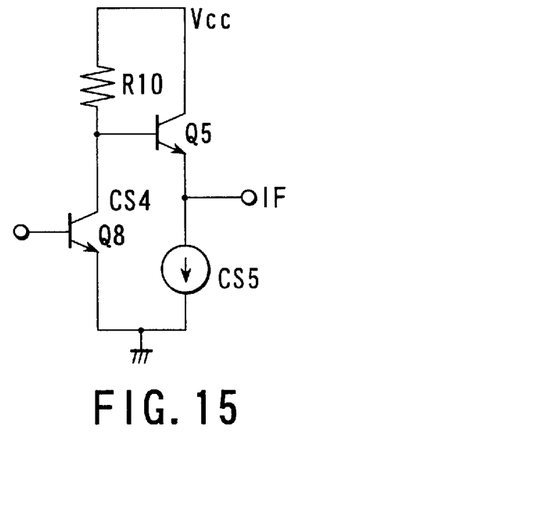

FIGS. 14 and 15 are circuit diagrams each showing a modification of an output buffer circuit 3.

In the output buffer circuit shown in FIG. 14, an IF signal voltage is inputted from the two output terminals of the transistors Q2 and Q3 of a multiplying circuit 1. The input signal is impedance-converted by two emitter follower circuits consisting of transistors Q4 and Q5 and current source CS4 and CS5 to a signal with an impedance of, e.g., 50 Ω, corresponding to that of a transmission line, and outputted.

In the output buffer circuit shown in FIG. 15, an IF signal voltage is inputted from one of the output terminals of a multiplying circuit 1, and amplified by a common emitter amplifier consisting of a transistor Q8 and a load resistor R10. The amplified signal is impedance-converted by an emitter follower circuit consisting of a transistors Q5 and a current source CS5 to a signal with an impedance of, e.g., 50 ΩQ, corresponding to that of a transmission line, and outputted.

Figure 16:
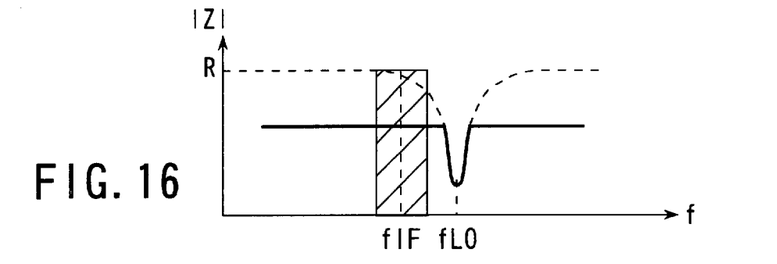
FIG. 16 is a graph showing the impedance characteristic to explain the effect of the output buffer circuit shown in FIG. 15.

Incidentally, if a difference frequency between an LO signal frequency and an IF signal frequency is small, or the Q factor of an LC series resonance circuit is small, the impedance characteristic of a notch circuit may not be flat in an IF signal band, as shown with the broken line in FIG. 16. Consequently, a gain fluctuation is caused within a desired signal band and makes it difficult to obtain a signal with a wide band.

In this case, an output buffer circuit 3 may be formed of a trans-impedance amplifier having a small input impedance. With this arrangement, the impedance characteristic relative to the output terminal of a multiplying circuit 1 becomes one as shown with the solid line in FIG. 16, so that a flat output signal level is obtained in the IF signal band.

Figure 17:
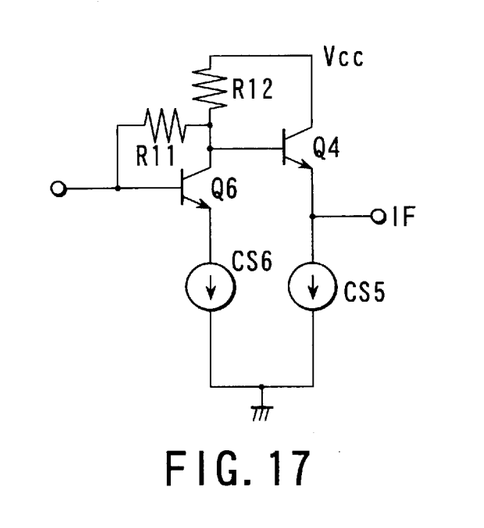
FIGS. 17 and 18 are circuit diagrams each showing a modification of an output buffer circuit used in the frequency converters according to the present invention.
Figure 18:
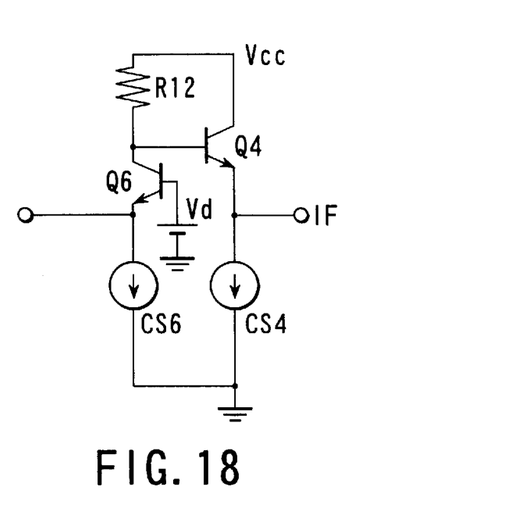

FIGS. 17 and 18 are circuit diagrams each showing a modification of an output buffer circuit 3, having a trans-impedance amplifier at the input portion.

In the output buffer circuit shown in FIG. 17, there is shown a trans-impedance amplifier consisting of a transistor Q6, a current source CS6 connected to the emitter terminal of the transistor Q6, a resistor R11 connected between the collector terminal and the base terminal of the transistor Q6, and a resistor R12 connected between the collector terminal of the transistor Q6 and a power supply Vcc. The output of the trans-impedance amplifier is taken out from the collector terminal of the transistor Q6, and inputted to the base terminal of a transistor Q4 of the next stage.

In the output buffer circuit shown in FIG. 18, the resistor R11 of the trans-impedance amplifier shown in FIG. 17 is omitted, and a DC bias voltage Vb is applied to the base terminal of the transistor Q6. In this arrangement, the output of the trans-impedance amplifier is also taken out from the collector terminal of the transistor Q6, and inputted to the base terminal of a transistor Q4 of the next stage. Where a multiplying circuit 1 has differential outputs, trans-impedance amplifiers are connected to the two output terminals of the multiplying circuit 1, respectively. In this case, the two trans-impedance amplifiers should be substantially the same, in consideration of the balance of the multiplying circuit.

The output buffer circuits shown in FIGS. 17 and 18 have a trans-impedance amplifier at the input portion, and thus the input impedance can be smaller than the load resistance of a load circuit. As a result, an impedance characteristic as shown with the solid line in FIG. 16 can be obtained at the output terminal of the multiplying circuit 1.

The trans-impedance relative to the desired signal in this case takes on the value of the resistor R11 in the case shown in FIG. 17, and the value of the resistor R12 in the case shown in FIG. 18. Accordingly, by setting the resistance of them to be equal to the impedance R shown in FIG. 16, a desired signal level can be sufficiently obtained over a wide band. On the other hand, in these cases, an undesired signal is removed by the notch frequency of a notch circuit 4, and thus an unnecessary distortion is suppressed.

As described above, where an output buffer circuit 3 is provided with a circuit for reducing its impedance, such as a trans-impedance amplifier, it is possible to keep the gain substantially constant over the desired signal band, and to prevent the desired signal from being distorted in the output buffer circuit 3, thereby being advantageous in lowering the distortion.

An explanation will be given to other embodiments according to the present invention, with reference to FIGS. 19 to 22.

Figure 19:
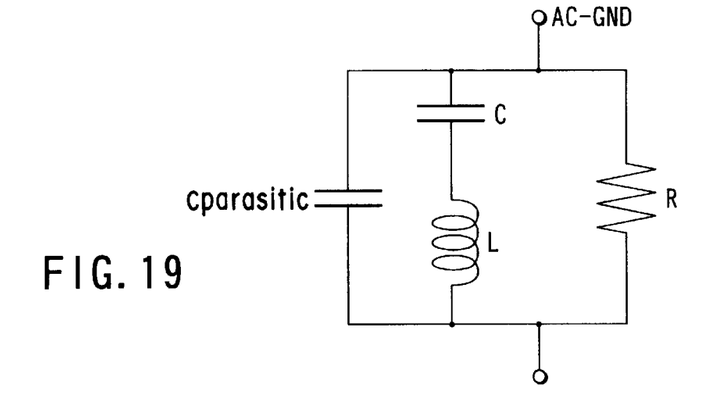
FIG. 19 is a circuit diagram showing a circuit equivalent to the combination of a load circuit and a notch circuit shown in FIG. 2.

A practical integrated circuit according to the frequency converter shown in FIG. 2 brings about parasitic capacities between the collector terminal of the transistor Q3 and the substrate, and between wiring layers. In consideration of the parasitic capacities, the load and notch circuits 2 and 4 can be equivalently expressed by a circuit diagram shown in FIG. 19. It should be noted, however, that FIG. 19 shows only one resistor R, one inductor L, and one capacitor C, which represent one of a pair of the load resistors R1 and R2 connected to the two output terminals of the multiplying circuit 1, and one of a pair of the LC series resonance circuits connected in parallel to the load resistors R1 and R2, and consisting of the inductors L1 and L2 and the capacitors C1 and C2. The symbol "$C_{parasitic}$" shown in FIG. 19 represents all the parasitic capacities described above.

The impedance of the LC series resonance circuit shown in FIG. 19 is expressed by the following formula (3).

$$Z_{LC} = J\{(\omega^2 LC - 1)/\omega C\} \quad (3)$$

where J is an imaginary unit, and ω is an angular frequency.

Consequently, the impedance of the LC series resonance circuit becomes inductive (the imaginary unit is a positive number) at a frequency higher than a resonance frequency f0 ($= \frac{1}{2}\pi(LC)^{1/2}$). Where there is a parasitic capacity component, such as the $C_{paracitic}$ shown in FIG. 19, the circuit shown in FIG. 19 appears to be a circuit in which an LC parallel resonance circuit is connected in parallel to the resistor R, at a frequency of f0 or more. More specifically, the impedance of the circuit shown in FIG. 19 is given by the following formula (4).

$$Z_{LCC_{parasitic}} = R\left[\frac{1}{1 + j\omega R\left(\frac{C}{1 - \omega^2 LC} + C_{parasitic}\right)}\right] \quad (4)$$

Accordingly, a series resonance is caused at a frequency of f=f0=$\frac{1}{2}\pi(LC)^{1/2}$, at which there is a notch for the impedance to be zero. Furthermore, a parallel resonance is caused at a frequency of f=f1=f0$(1+C/C_{paracitic})^{1/2}$ at which the impedance takes on the maximum value R.

Figure 20:
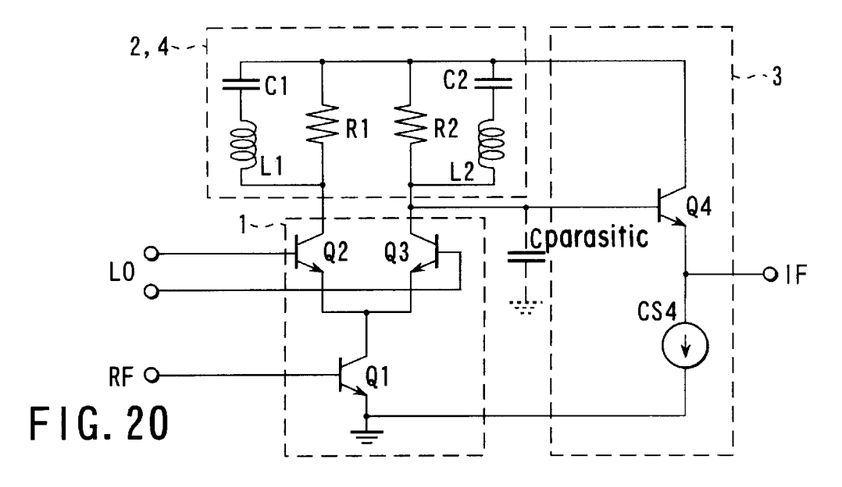
FIG. 20 is a circuit diagram showing the structure of a frequency converter in consideration of the equivalent circuit shown in FIG. 19.

FIG. 20 is a circuit diagram showing a frequency converter in consideration of the parasitic capacity $C_{paracitic}$ shown in FIG. 19. In the frequency converter, it is assumed that the resonance frequency f0 of LC series resonance circuits used in a notch circuit 4 agrees with an LO signal frequency. In this case, the impedance characteristic of the notch circuit is provided with a notch at the LO signal frequency, and thus an undesired signal is sufficiently suppressed at the LO signal frequency.

However, as described above, due to the presence of the parasitic capacity $C_{paracitic}$, there is a parallel resonance point at a frequency f1 higher than the LO signal frequency (=series resonance frequency). Consequently, when the parallel resonance frequency f1 becomes equal or close to the frequency of another undesired signal, such as a higher harmonic of the LO signal, the higher harmonic component of the LO signal appears as an undesired signal in the frequency-converted output, thereby deteriorating the distortion characteristic.

Figure 21:
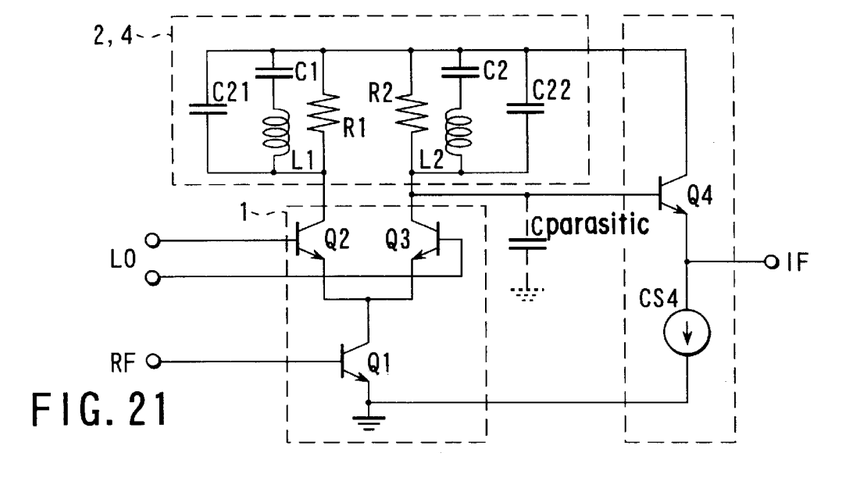
FIG. 21 is a circuit diagram showing the structure of a frequency converter according to another embodiment of the present invention.

FIG. 21 is a circuit diagram showing the structure of a frequency converter, which can improve the above described matter, according to another embodiment of the present invention. Between the collector terminals of transistors Q2 and Q3, and a power supply Vcc, capacitors C21 and C22 are connected in parallel to load resistors R1 and R2, respectively. With this arrangement, the parallel resonance frequency is expressed by the following formula (5).

$$f2=f0\{1+C/(C_{paracitic}+C')\}^{1/2} \neq \text{(undesired signal frequency)} \quad (5)$$

where C is the capacity of the capacitors C1 and C2 of LC series resonance circuits, and C' is the capacity of the added capacitors C21 and C22.

In other words, the parallel resonance frequency is shifted from f1 to f2 with the added capacitors C21 and C22. Consequently, where the capacity of the capacitors C21 and C22 is selected such that the parallel resonance frequency f2 is a frequency other than that of an undesired signal, such as a higher harmonic component of an LO signal, the undesired signal does not appear in the frequency-converted output, thereby preventing deterioration in the distortion characteristic.

The capacity of the capacitors C21 and C22 is set to be a value such that the desired IF signal band is not affected. More specifically, the capacitors C21 and C22 are selected to satisfy ½ πR·C21>>fIF, and ½ πR·C22>>fIF. By doing so, the wide band characteristic is maintained in the IF signal band.

Figure 22:
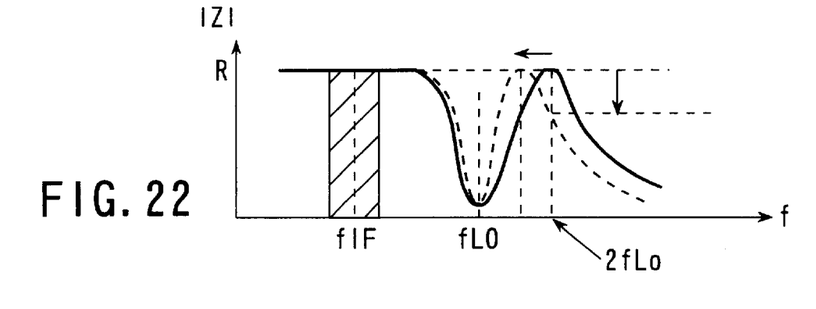
FIG. 22 is a graph showing the impedance characteristic of the notch circuit of the frequency converter shown in FIG. 21.

In this respect, FIG. 22 is a graph showing the impedance characteristic of the notch circuit shown in FIG. 21. In FIG. 21, the solid line shows the characteristic where no capacitors C21 and C22 are arranged, while the broken line shows the characteristic where the capacitors C21 and C22 are arranged. In this case, the second harmonic component of the LO signal frequency is supposed to be a second undesired signal other than the LO signal frequency components.

As shown in FIG. 22, where the capacitors C21 and C22 are added, the suppression ratio of the second harmonic component (with a frequency of 2 fLO) of the LO signal frequency is improved, and furthermore the suppression ratios of the third and further higher harmonic components are also improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency converter comprising:
   a multiplying circuit configured to multiply an RF (Radio Frequency) signal and an LO (Local Oscillation) signal and output a difference frequency signal having a difference frequency between those of the RF and LO signals from an output terminal;
   a load circuit connected to said output terminal of the multiplying circuit;
   an output buffer circuit having an input terminal connected to said output terminal of the multiplying circuit and an output terminal for outputting a signal into a next stage; and
   a notch circuit connected to said input terminal of the output buffer circuit and configured to have an impedance characteristic in which impedance is abruptly reduced to provide a valley point at an undesired signal frequency, in order to remove a component with said undesired signal frequency from said difference frequency signal.

2. The converter according to claim 1, wherein said notch circuit comprises an LC series resonance circuit having a resonance frequency in agreement with said undesired signal frequency.

3. The converter according to claim 2, wherein said load circuit comprises a load resistor, to which said LC series resonance circuit is connected in parallel.

4. The converter according to claim 3, wherein said notch circuit further comprising a capacitor connected in parallel to said load resistor.

5. The converter according to claim 2, wherein said output terminal of the multiplying circuit comprises first and second output terminals for outputting differential signal components, and said LC series resonance circuit comprises first and second LC series resonance circuits connected to said first and second output terminals, respectively.

6. The converter according to claim 5, wherein said first and second LC series resonance circuits are substantially the same as each other.

7. The converter according to claim 2, wherein said output terminal of the multiplying circuit comprises first and second output terminals for outputting differential signal components, and said LC series resonance circuit connects said first and second output terminals to each other.

8. The converter according to claim 7, wherein said LC series resonance circuit comprises first and second LC series resonance circuits substantially the same as each other, which are connected in parallel to each other in an opposite direction state.

9. The converter according to claim 7, wherein said LC series resonance circuit comprises first and second LC series resonance circuits substantially the same as each other, which are connected in series to each other in an opposite direction state.

10. The converter according to claim 2, wherein said LC series resonance circuit includes an inductance of a bonding wire.

11. The converter according to claim 2, wherein said LC series resonance circuit is integrated with said multiplying circuit and said output buffer circuit within one chip.

12. The converter according to claim 1, wherein sa d undesired signal frequency agrees with said frequency of the LO signal.

13. The converter according to claim 1, wherein said impedance characteristic is arranged such that impedance is abruptly reduced to produce a valley point at a second undesired signal frequency.

14. The converter according to claim 13, wherein said second undesired signal frequency agrees with a higher harmonic frequency of said LO signal.

15. The converter according to claim 13, wherein said notch circuit comprises first and second LC series resonance circuits connected in parallel to each other, and having resonance frequencies in agreement with said undesired signal frequency and said second undesired signal frequency, respectively.

16. The converter according to claim 1, wherein said output buffer circuit has an input impedance arranged such that a gain becomes substantially constant within a certain signal band.

17. The converter according to claim 16, wherein said output buffer circuit includes a circuit for decreasing said input impedance.

18. A frequency converter comprising:
   a multiplying circuit configured to multiply an RF (Radio Frequency) signal and an LO (Local Oscillation) signal and output a difference frequency signal having a difference frequency between those of the RF and LO signals, said difference frequency signal comprising differential signal components outputted from first and second output terminals, respectively;

a load circuit connected to said first and second output terminals of the multiplying circuit;

an output buffer circuit having first and second input terminals connected to said first and second output terminals of the multiplying circuit, respectively, and an output terminal for outputting a signal into a next stage; and a notch circuit connected to said first and second input terminals of the output buffer circuit and configured to have an impedance characteristic in which impedance is abruptly reduced to provide a valley point at an undesired signal frequency, in order to remove a component with said undesired signal frequency from said difference frequency signal, said notch circuit comprising first and second LC series resonance circuits connected to said first and second output terminals of the multiplying circuit, respectively, and having a resonance frequency in agreement with said undesired signal frequency.

19. The converter according to claim 18, wherein said first and second LC series resonance circuits are substantially the same as each other.

20. The converter according to claim 18, wherein said load circuit comprises first and second load resistors, to which said first and second LC series resonance circuits are connected in parallel, respectively.

* * * * *